(12) United States Patent
Suzuki et al.

(10) Patent No.: US 10,319,393 B2
(45) Date of Patent: Jun. 11, 2019

(54) SPEECH RECOGNITION SYSTEM AND GAIN SETTING SYSTEM

(71) Applicant: Alpine Electronics, Inc., Shinagawa-ku, Tokyo (JP)

(72) Inventors: Hirokazu Suzuki, Iwaki (JP); Toru Marumoto, Iwaki (JP)

(73) Assignee: ALPINE ELECTRONICS, INC., Tokyo (JP)

(*) Notice: Subject to any disclaimer, the term of this patent is extended or adjusted under 35 U.S.C. 154(b) by 237 days.

(21) Appl. No.: 15/221,027

(22) Filed: Jul. 27, 2016

(65) Prior Publication Data
US 2017/0092289 A1 Mar. 30, 2017

(30) Foreign Application Priority Data

Sep. 28, 2015 (JP) ................. 2015-189433

(51) Int. Cl.
*G10L 21/034* (2013.01)
*H03G 3/30* (2006.01)
*G10L 15/20* (2006.01)
*H03G 3/32* (2006.01)

(52) U.S. Cl.
CPC ............ *G10L 21/034* (2013.01); *G10L 15/20* (2013.01); *H03G 3/3005* (2013.01); *H03G 3/32* (2013.01)

(58) Field of Classification Search
CPC ......... G10L 21/034; G10L 15/20; H03G 3/32; H03G 3/3005
USPC ........................................................ 704/225
See application file for complete search history.

(56) References Cited

U.S. PATENT DOCUMENTS

| | | | | |
|---|---|---|---|---|
| 2004/0138882 A1* | 7/2004 | Miyazawa | ............ | G10L 15/065 704/233 |
| 2008/0173103 A1* | 7/2008 | Shimizu | .................. | G01L 3/102 73/862.335 |
| 2011/0286604 A1* | 11/2011 | Matsuo | ................ | G10K 11/178 381/71.1 |

FOREIGN PATENT DOCUMENTS

| | | |
|---|---|---|
| JP | H6-067689 | 3/1994 |
| JP | 2002-314637 | 10/2002 |
| JP | 2007-140102 | 6/2007 |
| JP | 5614767 | 11/2010 |
| JP | 5457293 | 1/2014 |
| JP | 5614767 | 9/2014 |

* cited by examiner

*Primary Examiner* — Bharatkumar S Shah
(74) *Attorney, Agent, or Firm* — Brinks Gilson & Lione

(57) ABSTRACT

When an instruction to start voice input is received from the user, a gain controller acquires, from a gain table which defines a correspondence between vehicle speed ranges and gains, a gain corresponding to a vehicle speed range including the vehicle speed of a vehicle detected by a vehicle speed detector, and sets the acquired gain as the gain of an input amplifier that amplifies an input audio signal output by a microphone. As a gain corresponding to each vehicle speed range, the gain table records a gain of the input amplifier corresponding, in an experimentally determined frequency distribution of peak values in the vehicle speed range, to a maximum frequency in the range of magnitude of voice output as an input audio signal by the microphone and to be input to a speech recognition engine as voice having a magnitude within the input range of the speech recognition engine.

10 Claims, 7 Drawing Sheets

FIG. 2

| VEHICLE SPEED V (km/h) | GAIN |
|---|---|
| V = 0 | G1 |
| 0 < V ≤ 20 | G2 |
| 20 < V ≤ 40 | G3 |
| 40 < V ≤ 60 | G4 |
| 60 < V ≤ 80 | G5 |
| 80 < V ≤ 100 | G6 |
| 100 < V ≤ 120 | G7 |
| 120 < V ≤ 140 | G8 |
| 140 < V | G9 |

FIG. 5

| VEHICLE SPEED V (km/h) | WINDOW | IN/OUT OF TUNNEL | WIPER | GAIN |
|---|---|---|---|---|
| V = 0 | OPEN | IN | ON | G01 |
| | | | OFF | G02 |
| | | OUT | ON | G03 |
| | | | OFF | G04 |
| | CLOSED | IN | ON | G05 |
| | | | OFF | G06 |
| | | OUT | ON | G07 |
| | | | OFF | G08 |
| 0 < V ≤ 20 | OPEN | IN | ON | G09 |
| | | | OFF | G10 |
| | | OUT | ON | G11 |
| | | | OFF | G12 |
| | CLOSED | IN | ON | G13 |
| | | | OFF | G14 |
| | | OUT | ON | G15 |
| | | | OFF | G16 |
| ⋮ | ⋮ | ⋮ | ⋮ | ⋮ |

| VEHICLE TYPE | yyyyyyyy | |
|---|---|---|
| VEHICLE TYPE | xxxxxxxx | |
| GAIN TABLE | VEHICLE SPEED V (km/h) | GAIN |
| | V = 0 | G1 |
| | 0 < V ≤ 20 | G2 |
| | 20 < V ≤ 40 | G3 |
| | 40 < V ≤ 60 | G4 |
| | 60 < V ≤ 80 | G5 |
| | 80 < V ≤ 100 | G6 |
| | 100 < V ≤ 120 | G7 |
| | 120 < V ≤ 140 | G8 |
| | 140 < V | G9 |

| VEHICLE-TYPE IDENTIFICATION INFORMATION | VEHICLE SPEED V (km/h) | PEAK VALUE |
|---|---|---|

SPEECH RECOGNITION SYSTEM AND GAIN SETTING SYSTEM

RELATED APPLICATIONS

The present application claims priority to Japanese Patent Appln. No. 2015-189433, filed Sep. 28, 2015, the entirety of which is hereby incorporated by reference.

BACKGROUND

1. Field of the Invention

The present invention relates to a technique for controlling the input gain of an audio signal in a speech recognition system.

2. Background Art

A technique for controlling the input gain of an audio signal in a speech recognition system, such as the one disclosed in Japanese Patent No. 5614767, is known. The technique involves learning a statistical distribution of peak values of input audio signals, and setting the input gain of an audio signal such that when an audio signal is input with a distribution equal to the learned distribution, the magnitude of the audio signal after amplification falls within the input range of the speech recognition system as much as possible.

Another technique for controlling the input gain of an audio signal in a speech recognition system, such as the one disclosed in Japanese Patent No. 5457293, is also known. The technique involves calculating the mean amplitude distribution of spoken voice components contained in audio signals while repeatedly calculating the amplitude distribution of noise, and setting the input gain of an audio signal, in accordance with the mean amplitude distribution of spoken voice components and the previously calculated amplitude distribution of noise, such that the magnitude of an audio signal input to the speech recognition system falls within a proper range.

In the technique of setting the input gain of an audio signal in accordance with the learned statistical distribution of peak values of input audio signals, the input gain of the audio signal cannot be appropriately set until the peak values of a statistically significant number of audio signals can be acquired. Similarly, in the technique of setting the input gain of an audio signal in accordance with the mean amplitude distribution of spoken voice components and the previously calculated amplitude distribution of noise, the input gain of the audio signal cannot be appropriately set until the mean amplitude distribution of spoken voice components is calculated by acquiring a statistically significant number of audio signals.

This means that using these techniques may lead to frequent failures in speech recognition immediately after the start of use of the speech recognition system, and the user may be discouraged from using the speech recognition system.

Additionally, these techniques are disadvantageous in that they require a relatively complex configuration, such as a configuration for learning a statistical distribution of peak values of audio signals, or a configuration for repeatedly calculating the amplitude distribution of noise and calculating the mean amplitude distribution of the magnitude of spoken voice components contained in audio signals.

SUMMARY

Accordingly, an object of the present invention is to appropriately set the input gain of an audio signal for a speech recognition system on a vehicle immediately after the start of use of the speech recognition system.

To achieve the object described above, forms of the present invention provide a speech recognition system mounted on a vehicle. The speech recognition system includes a microphone configured to convert input voice into an input audio signal and output the input audio signal; a variable-gain input amplifier configured to amplify the input audio signal output by the microphone; a speech recognition unit configured to perform speech recognition on voice represented by the input audio signal amplified by the input amplifier; a vehicle speed detector configured to detect a vehicle speed of the vehicle; a storage unit configured to store gain control information which records a correspondence between vehicle speeds of the vehicle and gains of the input amplifier; and a gain controller configured to acquire the vehicle speed detected by the vehicle speed detector, and control a gain of the input amplifier to a gain recorded in the gain control information as a gain corresponding to the acquired vehicle speed.

In the speech recognition system, the gain control information may record a correspondence between each vehicle speed range and a gain of the input amplifier corresponding to the vehicle speed range. The gain of the input amplifier corresponding to the vehicle speed range may be a gain that corresponds, in an experimentally determined frequency distribution of peak values of an input audio signal output by the microphone in the vehicle running at a vehicle speed within the vehicle speed range, to a maximum frequency of a peak value having a magnitude that falls within an input range of the speech recognition unit when the gain is used for amplification. The gain controller may acquire a vehicle speed detected by the vehicle speed detector, and control the gain of the input amplifier to a gain recorded in the gain control information as a gain of the input amplifier corresponding to a vehicle speed range including the acquired vehicle speed.

The magnitude of voice input to the speech recognition system in a typical in-vehicle environment is highly correlated with the vehicle speed of the vehicle. In the speech recognition system described above, gain control information which records a correspondence between vehicle speeds and gains generally considered appropriate as the gains of the input amplifier for the vehicle speeds is stored in the storage unit in advance. Thus, a generally appropriate gain can be set for the input amplifier immediately after the start of the user's use of the speech recognition system. Also, with a simple configuration for detecting a vehicle speed and setting the gain of the input amplifier in accordance with the vehicle speed, the gain of the input amplifier can be controlled appropriately.

The speech recognition system may further include a state detector configured to detect one or more predetermined states of the vehicle. The gain control information may record a correspondence between combinations of vehicle speed and the one or more predetermined states and gains of the input amplifier. The gain controller may acquire a vehicle speed detected by the vehicle speed detector and a state detected by the state detector, and control the gain of the input amplifier to a gain recorded in the gain control information as a gain corresponding to a combination of the acquired vehicle speed and the acquired state. In this case, the one or more predetermined states include at least a vehicle window open/closed state indicating whether windows of the vehicle are open, or a vehicle wiper on/off state indicating whether a wiper of the vehicle is in operation.

The speech recognition system may further include an in-tunnel running detector configured to detect an in-tunnel/out-of-tunnel state indicating whether the vehicle is running in a tunnel. The gain control information may record a correspondence between combinations of vehicle speed and in-tunnel/out-of-tunnel state and gains of the input amplifier. The gain controller may acquire a vehicle speed detected by the vehicle speed detector and an in-tunnel/out-of-tunnel state detected by the in-tunnel running detector, and control the gain of the input amplifier to a gain recorded in the gain control information as a gain corresponding to a combination of the acquired vehicle speed and the acquired in-tunnel/out-of-tunnel state.

With this configuration of the speech recognition system, a more appropriate gain can be set for the input amplifier by setting it in accordance not only with the vehicle speed, but also with the vehicle window open/closed state, the wiper on/off state, or the in-tunnel/out-of-tunnel state relatively highly correlated with the magnitude of voice input to the speech recognition system.

The speech recognition system may further include a mobile communication device configured to perform mobile communication; and a gain-control-information acquiring unit configured to access a server storing the gain control information through the mobile communication, acquire the gain control information from the server, and store the acquired gain control information in the storage unit.

The speech recognition system may further include a mobile communication device configured to perform mobile communication; and a gain-control-information acquiring unit configured to access a server storing gain control information for each vehicle type through the mobile communication, acquire gain control information for a vehicle type of the vehicle having the speech recognition system thereon from the server, and store the acquired gain control information in the storage unit.

To address the object described above, forms of the present invention also provide a gain setting system that includes a speech recognition system mounted on a vehicle, and a server configured to be accessible by the speech recognition system through mobile communication. The server includes a gain-control-information storage unit configured to store gain control information which records a correspondence between vehicle speeds of the vehicle and gains, and a gain-control-information providing unit configured to provide the gain control information stored in the gain-control-information storage unit to the speech recognition system accessing the server. The speech recognition system includes a mobile communication device configured to perform the mobile communication; a microphone configured to convert input voice into an input audio signal and output the input audio signal; a variable-gain input amplifier configured to amplify the input audio signal output by the microphone; a speech recognition unit configured to perform speech recognition on voice represented by the input audio signal amplified by the input amplifier; a vehicle speed detector configured to detect a vehicle speed of the vehicle; a storage unit; a gain-control-information acquiring unit configured to access the server through the mobile communication, acquire the gain control information from the server, and store the acquired gain control information in the storage unit; and a gain controller configured to acquire the vehicle speed detected by the vehicle speed detector, and control a gain of the input amplifier to a gain recorded in the gain control information stored in the storage unit as a gain corresponding to the acquired vehicle speed.

The gain setting system may be configured such that the gain-control-information storage unit stores gain control information for each vehicle type; and the gain-control-information acquiring unit acquires, from the server, gain control information for a vehicle type of the vehicle having the speech recognition system mounted thereon, and stores the acquired gain control information in the storage unit. In this case, the gain control information for each vehicle type records a correspondence between vehicle speeds of the vehicle of the vehicle type and gains.

In the gain setting system, the server may include a gain-control-information managing unit configured to manage the gain control information stored in the gain-control-information storage unit. Also in the gain setting system, the speech recognition system may include a peak value detector configured to detect a peak value of the input audio signal output by the microphone; and a peak-value-information reporting unit configured to transmit, to the gain-control-information managing unit through the mobile communication, peak value information including a peak value detected by the peak value detector during speech recognition performed by the speech recognition unit and a vehicle speed detected by the vehicle speed detector when the peak value is detected. Then, on the basis of the received peak value information, the gain-control-information managing unit may determine, for each vehicle speed range, a frequency distribution of peak values contained in the peak value information including vehicle speeds within the vehicle speed range; generate gain control information which records, as a gain corresponding to the vehicle speed range, a gain that corresponds, in the frequency distribution, to a maximum frequency of a peak value having a magnitude that falls within an input range of the speech recognition unit when the gain is used for amplification; and store the generated gain control information in the gain-control-information storage unit.

When the gain-control-information storage unit stores gain control information for each vehicle type as described above, the gain setting system may have the following configuration. That is, the server includes a gain-control-information managing unit configured to manage the gain control information stored in the gain-control-information storage unit; and the speech recognition system includes a peak value detector configured to detect a peak value of the input audio signal output by the microphone, and a peak-value-information reporting unit configured to transmit, to the gain-control-information managing unit through the mobile communication, peak value information including a peak value detected by the peak value detector during speech recognition performed by the speech recognition unit, a vehicle speed detected by the vehicle speed detector when the peak value is detected, and a vehicle type of the vehicle having the speech recognition system mounted thereon. Then, on the basis of the received peak value information, the gain-control-information managing unit determines, for each vehicle speed range in each vehicle type, a frequency distribution of peak values contained in the peak value information including the vehicle type and vehicle speeds within the vehicle speed range; generates gain control information for the vehicle type recording, as a gain corresponding to the vehicle speed range, a gain that corresponds, in the frequency distribution, to a maximum frequency of a peak value having a magnitude that falls within an input range of the speech recognition unit when the gain is used for amplification; and stores the generated gain control information in the gain-control-information storage unit.

With any of the gain setting systems described above, the speech recognition system mounted on the vehicle can acquire gain control information from the server, and set a gain appropriate for the vehicle speed in the input amplifier by setting it in accordance with the acquired gain control information. As described above, gain control information recording a correspondence between vehicle speeds and gains appropriate for a typical user of the input amplifier, in a typical in-vehicle environment, is stored in the server in advance. Thus, a generally appropriate gain can be set for the input amplifier immediately after start of the user's use of the speech recognition system.

When the server includes the gain-control-information managing unit, gain control information can be generated in the server on the basis of a relationship between the magnitude of voice input to an actual speech recognition system on each vehicle and the vehicle speed.

According to forms of the present invention, the input gain of an audio signal for a speech recognition system mounted on a vehicle can be appropriately set immediately after the start of use of the speech recognition system.

BRIEF DESCRIPTION OF THE DRAWINGS

FIG. 2 illustrates a gain table according to the first form of the present invention.

FIG. 5 illustrates a gain table according to the second form of the present invention.

DETAILED DESCRIPTION OF THE DRAWINGS

Figure 1:
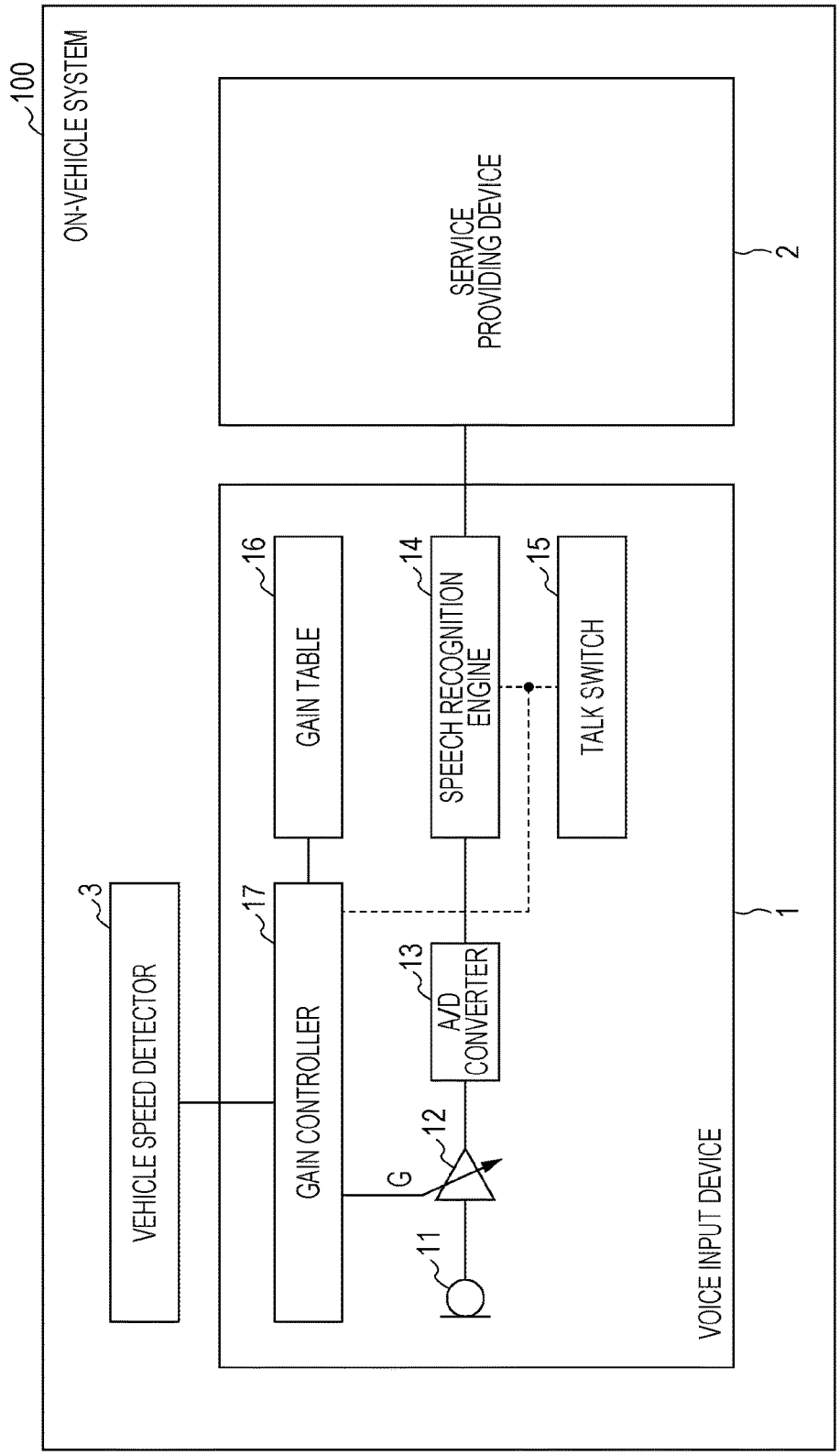
FIG. 1 is a block diagram illustrating a configuration of a speech recognition system according to a first form of the present invention.

FIG. 1 illustrates a configuration of an on-vehicle system 100 according to a first form of the present invention.

The on-vehicle system 100 according to the first form is a system mounted on a vehicle. As illustrated, the on-vehicle system 100 includes a voice input device 1, a service providing device 2 configured to provide a user with a predetermined service while using the voice input device 1 for input, and a vehicle speed detector 3 configured to detect the vehicle speed of the vehicle.

The vehicle speed detector 3 may be configured to detect the vehicle speed in any suitable way. For example, the vehicle speed detector 3 may be configured to detect the vehicle speed from a vehicle-speed pulse signal representing a tire rotation speed output from the vehicle, detect the vehicle speed by extracting vehicle speed data from an in-vehicle network such as a controller area network (CAN), or detect the vehicle speed by using a global positioning system (GPS).

The service providing device 2 is, for example, a car navigation device configured to provide the user with a navigation service while using the voice input device 1 for input, or an audiovisual (AV) device configured to provide the user with an audio and video playback service while using the voice input device 1 for input.

The voice input device 1 includes a microphone 11, an input amplifier 12 configured to amplify with an input gain G an input audio signal representing voice picked up by the microphone 11, an analog-to-digital (A/D) converter 13 configured to convert the input audio signal amplified by the input amplifier 12 into digital input audio data, a speech recognition engine 14 configured to perform a speech recognition process on the input audio data produced by the A/D converter 13, a talk switch 15 configured to receive an instruction to start voice input from the user, a gain table 16, and a gain controller 17 configured to control the gain G of the input amplifier 12 on the basis of the gain table 16.

Hardware-wise, the voice input device 1 may be formed by a computer including a central processing unit (CPU) and a memory. In this case, the gain controller 17 and the speech recognition engine 14 may be implemented when the computer executes a predetermined computer program.

In this configuration, the speech recognition engine 14 starts a speech recognition process when the user presses the talk switch 15. The speech recognition process involves detecting a spoken voice section in which the input audio data includes the user's spoken voice, and performing speech recognition (i.e., identifying the user's speech content) on the input audio data in the spoken voice section. The user's speech content identified by the speech recognition is output to the service providing device 2 and serves as an input to the service providing device 2.

FIG. 2 illustrates a gain table 16 in the voice input device 1.

As illustrated, the gain table 16 is a table that defines the correspondence between vehicle speeds and gains. Specifically, the gain table 16 contains entries corresponding to respective vehicle speed ranges. Each entry records a vehicle speed range and a gain corresponding to the vehicle speed range.

A gain corresponding to each vehicle speed range is determined in the following manner and recorded in the gain table 16.

That is, the calculation of a gain corresponding to each vehicle speed range involves collecting, while running a test vehicle at each vehicle speed, peak values of an input audio signal output by the microphone 11 in a spoken voice section detected by the speech recognition engine 14 and vehicle speeds detected by the vehicle speed detector 3 in the spoken voice section.

Figure 3A:
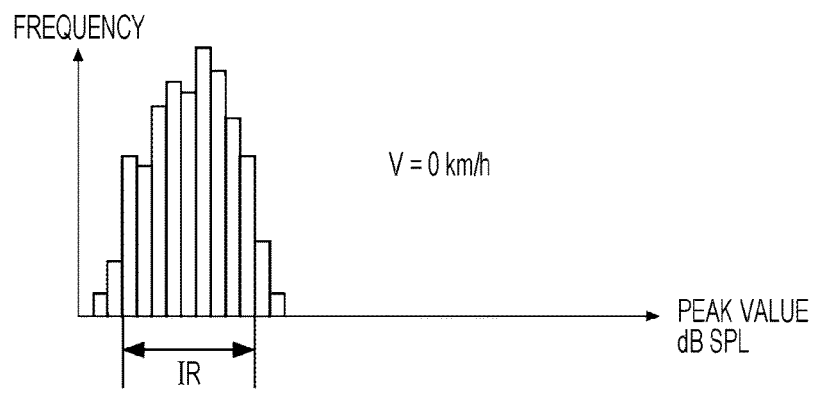
FIGS. 3A to 3C illustrate how a gain table is set according to the first form of the present invention.
Figure 3B:
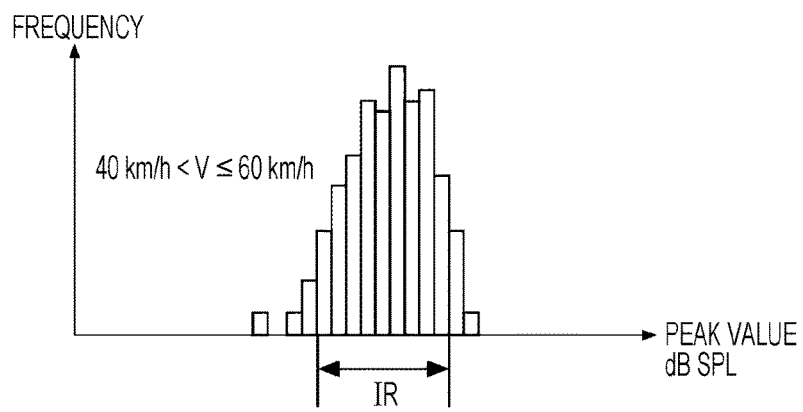
Figure 3C:
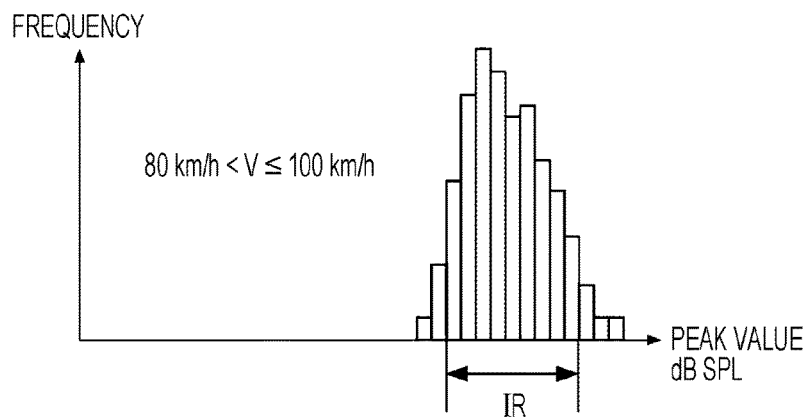

Then, from the collected peak values and vehicle speeds, the frequency distribution of peak values in each vehicle speed range is calculated as illustrated in FIGS. 3A to 3C. FIG. 3A illustrates the frequency distribution of peak values obtained when the vehicle is at idle (V=0 km/h). FIG. 3B illustrates the frequency distribution of peak values obtained when the vehicle speed (V) of the vehicle is greater than 40 km/h and less than or equal to 60 km/h. FIG. 3C illustrates the frequency distribution of peak values obtained when the vehicle speed (V) of the vehicle is greater than 80 km/h and less than or equal to 100 km/h. As illustrated, the distribution range of peak values shifts toward larger peak values with increasing vehicle speed.

The input range of the speech recognition engine 14 is the range of magnitude of voice that can be correctly received as input audio data by the speech recognition engine 14. The width of the input range of the speech recognition engine 14 is fixed. However, depending on the magnitude of the gain G of the input amplifier 12, the magnitude of voice that is input as input audio data into the speech recognition engine 14 varies. Therefore, depending on the gain G of the input amplifier 12, the range of the magnitude of voice output as an input audio signal by the microphone 11 and to be input, as input audio data of voice within the input range, to the speech recognition engine 14 varies. More specifically, as the gain G of the input amplifier 12 increases, the range of the magnitude of voice output as an input audio signal by the microphone 11 and input, as input audio data of voice within the input range, to the speech recognition engine 14 shifts toward smaller magnitudes of voice. Conversely, as the gain G of the input amplifier 12 decreases, the range of the magnitude of voice output as an input audio signal by the microphone 11 and input, as input audio data of voice within the input range, to the speech recognition engine 14 shifts toward greater magnitudes of voice.

On the basis of the calculated frequency distribution of peak values in each of the vehicle speed ranges shown in FIGS. 3A to 3C, the gain G of the input amplifier 12 corresponding to the maximum frequency in a range IR in the frequency distribution is determined for the vehicle speed range. Then, the determined gain G is recorded as the gain for the entry of the vehicle speed range in the gain table 16. Here, the range IR is the range of the magnitude of voice output as an input audio signal by the microphone 11 and to be input as input audio data of voice within the input range of the speech recognition engine 14. In other words, the range IR is obtained by amplifying the input range of the speech recognition engine 14 with a gain of 1/G (or −G db if G is expressed in db).

A higher vehicle speed range corresponds to a smaller gain. This is because the vehicle interior noise increases as the speed of the vehicle increases, and the loudness of user's spoken voice increases as the vehicle interior noise increases.

The gain table 16 created as described above is set in the voice input device 1 before delivery of the voice input device 1 to the user.

Therefore, the gain table 16 is common to all voice input devices 1 in respective on-vehicle systems 100.

The gain table 16 may be created in advance for each of various vehicle types by using the various types of vehicles as test vehicles. In this case, before delivery of the voice input device 1 to the user, the gain table 16 corresponding to the vehicle type of the vehicle on which the voice input device 1 is to be mounted is set in the voice input device 1.

Referring back to FIG. 1, the gain controller 17 controls the gain G of the input amplifier 12 in the following manner.

That is, when the user presses the talk switch 15, the gain controller 17 acquires a vehicle speed detected by the vehicle speed detector 3, acquires a gain recorded in the entry of the gain table 16 recording a vehicle speed range including the acquired vehicle speed, and sets the acquired gain as the gain G of the input amplifier 12.

As described above, the vehicle interior noise increases as the speed of the vehicle increases, and the loudness of user's spoken voice increases as the vehicle interior noise increases. This means that the magnitude of voice input to the voice input device 1 is highly correlated with the vehicle speed of the vehicle.

In the first form, as described above, the gain table 16 which records an experimentally determined correspondence between vehicle speeds and gains is prepared in advance. Then, for speech recognition, a gain corresponding to the vehicle speed is set for the input amplifier 12 using the gain table 16. Thus, in the first form, a generally appropriate gain can be set for the input amplifier 12 immediately after the start of use of the voice input device 1. Also, with a simple configuration for detecting a vehicle speed and setting the gain of the input amplifier 12 in accordance with the vehicle speed, the gain of the input amplifier 12 can be controlled appropriately.

A second form of the present invention will now be described.

Figure 4:
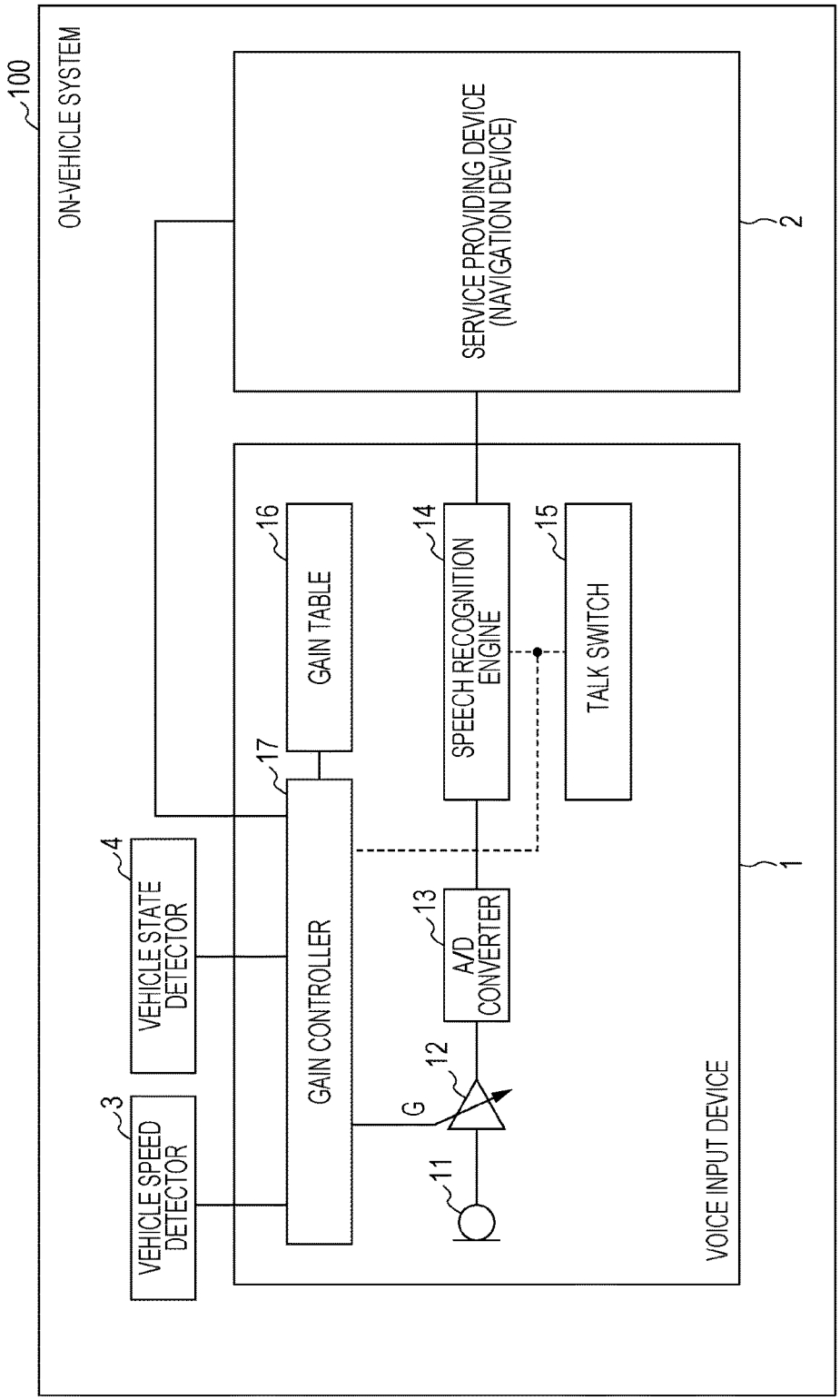
FIG. 4 is a block diagram illustrating a configuration of a speech recognition system according to a second form of the present invention.

FIG. 4 illustrates a configuration of an on-vehicle system 100 according to the second embodiment.

As illustrated, the on-vehicle system 100 according to the second form differs from the on-vehicle system 100 illustrated in FIG. 1 in that it includes a vehicle state detector 4. The content of the gain table 16 and how the gain controller 17 controls the gain G of the input amplifier 12 also differ from those in the first form. In the second form, a navigation device serves as the service providing device 2.

The vehicle state detector 4 is configured to detect a vehicle window open/closed state (indicating whether vehicle windows are open) and a wiper on/off state (indicating whether a wiper of the vehicle is in operation). The vehicle state detector 4 may detect the vehicle window open/closed state and the wiper on/off state either by using dedicated sensors for detecting these states or by extracting data representing these states from an in-vehicle network, such as a controller area network (CAN).

FIG. 5 illustrates the gain table 16 according to the second form.

As illustrated, the gain table 16 according to the second form is a table that defines the correspondence between the combinations of vehicle speed range, vehicle window open/closed state, in-tunnel/out-of-tunnel state (indicating whether the vehicle is running in a tunnel), and wiper on/off state and the gains.

A gain corresponding to each combination is determined by the following process and recorded in the gain table 16.

That is, the process involves running a test vehicle at each vehicle speed while varying the vehicle window open/closed state, in-tunnel/out-of-tunnel state, and wiper on/off state, and collecting peak values of an input audio signal output by the microphone 11 in a spoken voice section detected by the speech recognition engine 14 and vehicle speeds detected by the vehicle speed detector 3 in the spoken voice section.

Then, from the correspondence with the combination of collected peak values, collected vehicle speeds, and vehicle states described above, the frequency distribution of peak values is generated for each combination of vehicle speed range, vehicle window open/closed state, in-tunnel/out-of-tunnel state, and wiper on/off state.

Then, for each combination of vehicle speed range, vehicle window open/closed state, in-tunnel/out-of-tunnel state, and wiper on/off state, the gain G of the input amplifier 12 corresponding to the maximum frequency in a range IR in the frequency distribution of peak values generated for the combination is determined, and the determined gain G is recorded in the gain table 16 as the gain corresponding to the combination. Note that the range IR is the range of the magnitude of voice output as an input audio signal by the microphone 11 and to be input as input audio data of voice within the input range of the speech recognition engine 14.

The gain table 16 created as described above is set in the voice input device 1 before delivery of the voice input device 1 to the user. The gain table 16 described above may be created in advance for each of various vehicle types by using various types of vehicles as test vehicles. In this case, before delivery of the voice input device 1 to the user, the gain table 16 corresponding to the vehicle type of the vehicle on which the voice input device 1 is to be mounted is set in the voice input device 1.

Referring back to FIG. 4, the gain controller 17 controls the gain G of the input amplifier 12 in the following manner.

That is, when the user presses the talk switch 15, the gain controller 17 acquires a vehicle speed detected by the vehicle speed detector 3, and a vehicle window open/closed state and a wiper on/off state detected by the vehicle state detector 4. Additionally, by making an inquiry to the navigation device, the gain controller 17 determines whether the vehicle is currently running in a tunnel.

Then, the gain controller 17 acquires a gain recorded in the gain table 16 as a gain corresponding to the combination of the acquired vehicle speed range, the acquired vehicle window open/closed state, the acquired wiper on/off state, and the determined in-tunnel/out-of-tunnel state, and sets the acquired gain as the gain G of the input amplifier 12.

The vehicle window open/closed state, the wiper on/off state, and the in-tunnel/out-of-tunnel state are related to the level of vehicle interior noise, as in the case of the vehicle speed, and thus are relatively highly correlated with the magnitude of voice input to the voice input device 1. Therefore, in the second form where the gain of the input amplifier 12 is set in accordance not only with the vehicle speed but also with the window open/closed state, the wiper on/off state, and the in-tunnel/out-of-tunnel state, a more appropriate gain can be set in the input amplifier 12. Note that when vehicle windows are in the open state, the level of vehicle interior noise increases due to the noise of wind. When the wiper is in operation (on-state), the level of vehicle interior noise increases due to the noise of rain. Also, when the vehicle is running in a tunnel, the level of vehicle interior noise increases due to the noise of the running vehicle reflected off the tunnel wall.

In the second form, the gain of the input amplifier 12 is set by taking into account not only the vehicle speed of the vehicle, but also the vehicle window open/closed state, the wiper on/off state, and the in-tunnel/out-of-tunnel state. Other states related to the vehicle interior noise may also be taken into account, together with the vehicle speed of the vehicle, to set the gain of the input amplifier 12. For example, together with the vehicle speed of the vehicle, the type of tires mounted on the vehicle may also be taken into account to set the gain of the input amplifier 12.

Figure 6:
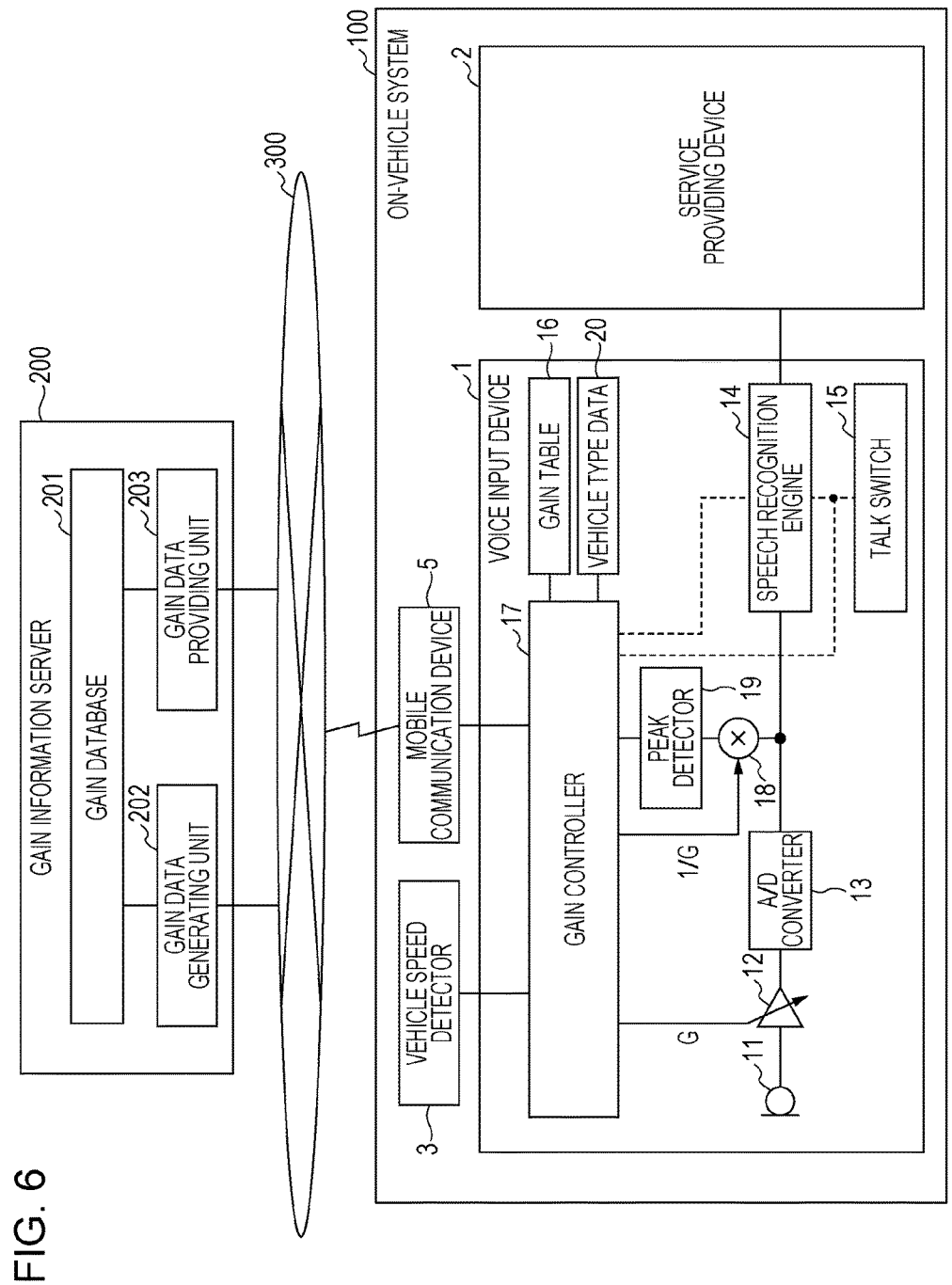
FIG. 6 is a block diagram illustrating a configuration of a speech recognition system according to a third form of the present invention.

FIG. 6 illustrates a configuration of an on-vehicle system 100 according to a third form.

As illustrated, the on-vehicle system 100 according to the third form includes the voice input device 1, the service providing device 2 configured to provide the user with a predetermined service while using the voice input device 1 for input, the vehicle speed detector 3 configured to detect the vehicle speed of the vehicle, and a mobile communication device 5 configured to perform communication through a mobile communication network.

The voice input device 1 includes the microphone 11, the input amplifier 12 configured to amplify with the input gain G an input audio signal representing voice picked up by the microphone 11, the A/D converter 13 configured to convert the input audio signal amplified by the input amplifier 12 into digital input audio data, the speech recognition engine 14 configured to perform a speech recognition process on the input audio data produced by the A/D converter 13, the talk switch 15, the gain controller 17 configured to control the gain G of the input amplifier 12 on the basis of the gain table 16, a multiplier 18, a peak detector 19, and vehicle type data 20 representing the vehicle type of the subject vehicle.

In this configuration of the voice input device 1, the speech recognition engine 14 starts a speech recognition process when the user presses the talk switch 15. The speech recognition process involves detecting a spoken voice section in which the input audio data includes the user's spoken voice, and performing speech recognition (i.e., identifying the user's speech content) on the input audio data in the spoken voice section. The user's speech content identified by the speech recognition is output to the service providing device 2 and serves as an input to the service providing device 2.

The gain controller 17 in the on-vehicle system 100 is capable of communicating with a gain information server 200 on a wide area network (WAN) 300, such as the Internet, through mobile communication performed by the mobile communication device 5.

As illustrated in FIG. 6, the gain information server 200 includes a gain database 201, a gain data generating unit 202, and a gain data providing unit 203.

Figures 7A, 7B:
FIGS. 7A and 7B illustrate gain data for each vehicle type and peak-value reporting data, respectively, according to the third form of the present invention.

FIG. 7A illustrates the content of the gain database 201 in the gain information server 200.

As illustrated, gain data corresponding to each vehicle type is accumulated in the gain database 201. Gain data for each vehicle type contains vehicle-type identification information representing the corresponding vehicle type and a gain table.

With this configuration, the gain controller 17 in the on-vehicle system 100 performs a peak-value reporting process, a gain-table acquiring process, and a gain control process.

First, the peak-value reporting process will be described.

During detection of a spoken voice section, the speech recognition engine 14 outputs a speech section signal to the gain controller 17. In the peak-value reporting process, upon receipt of the speech section signal, the gain controller 17 acquires a vehicle speed currently detected by the vehicle speed detector 3 and outputs 1/G, which is the inverse of the gain G currently set in the input amplifier 12, to the multiplier 18.

The multiplier 18 multiplies input audio data output from the A/D converter 13 by 1/G so as to make the magnitude of voice represented by the input audio data the same as the magnitude of voice output as an input signal from the microphone 11, and outputs the resulting audio data to the peak detector 19. The peak detector 19 performs a peak hold operation to hold the maximum value of voice represented by the audio data input from the multiplier 18.

In the peak-value reporting process, when the speech section signal is no longer received, the gain controller 17 acquires, as a peak value, the maximum value of voice held by the peak detector 19. Also in the peak-value reporting process, the gain controller 17 generates peak-value reporting data (such as that shown in FIG. 7B) containing vehicle-type identification information indicating the vehicle type of the subject vehicle represented by the vehicle type data 20, the vehicle speed previously acquired, and the acquired peak value, and transmits the generated peak-value reporting data to the gain data generating unit 202 in the gain information server 200 through mobile communication performed by the mobile communication device 5.

The peak-value reporting process performed by the gain controller 17 in the on-vehicle system 100 has been described.

Next, the gain-table acquiring process performed by the gain controller 17 in the on-vehicle system 100 will be described.

In the gain-table acquiring process, the gain controller 17 regularly (e.g., every other day) accesses the gain data providing unit 203 in the gain information server 200 through mobile communication performed by the mobile communication device 5, and issues a gain table request accompanied by vehicle-type identification information indicating the vehicle type of the subject vehicle represented by the vehicle type data 20.

Upon receipt of the gain table request, the gain data providing unit 203 in the gain information server 200 extracts, from the gain database 201, gain data containing vehicle-type identification information indicating the vehicle type indicated by the vehicle-type identification information accompanying the gain table request, and transmits a gain table contained in the extracted gain data for the vehicle type to the gain controller 17 (which is the issuer of the gain table request) as a response to the gain table request.

In the gain-table acquiring process, upon receipt of the gain table from the gain data providing unit 203 in the gain information server 200, the gain controller 17 updates the gain table 16 in the on-vehicle system 100 with the received gain table.

The gain-table acquiring process performed by the gain controller 17 in the on-vehicle system 100 has been described.

Next, the gain control process performed by the gain controller 17 in the on-vehicle system 100 will be described.

In the gain control process, when the user presses the talk switch 15, the gain controller 17 acquires a vehicle speed detected by the vehicle speed detector 3, acquires a gain contained in the entry of the gain table 16 which records a vehicle speed range including the acquired vehicle speed, and sets the acquired gain as the gain G of the input amplifier 12.

The gain control process performed by the gain controller 17 in the on-vehicle system 100 has been described.

Upon receipt of the peak-value reporting data from the gain controller 17 in the on-vehicle system 100, the gain data generating unit 202 in the gain information server 200 stores the received peak-value reporting data.

When, for each vehicle type, a sufficient number of pieces of peak-value reporting data containing vehicle-type identification information indicating the vehicle type are accumulated, the gain table 16 for the vehicle type is created. Then, the gain controller 17 updates the gain table in the gain data for the vehicle type in the gain database 201 with the created gain table 16.

A gain table for each vehicle type is created by generating the frequency distribution of peak values for each vehicle speed range from a set of peak-value reporting data containing vehicle-type identification information indicating the vehicle type, determining the gain G of the input amplifier 12 corresponding to the maximum frequency in a range IR in the generated frequency distribution, and recording the determined gain G as a gain for the entry of the vehicle speed range in the gain table 16 in the gain data for the vehicle type. Here, the range IR is the range of the magnitude of voice output as an input audio signal by the microphone 11 and to be input as input audio data of voice within the input range of the speech recognition engine 14.

In the voice input device 1 in the on-vehicle system 100 according to the third form, the gain table 16 is set before delivery of the voice input device 1 to the user, as in the first embodiment. In the initial state of gain data for each vehicle type in the gain database 201, a gain table created by using a vehicle of the vehicle type as a test vehicle is recorded.

In the third form, the gain table 16 can be created in the gain information server 200 on the basis of the relationship between the magnitude of actual voice input to the voice input device 1 in each vehicle and the vehicle speed. The voice input device 1 mounted on the vehicle acquires the gain table 16 from the gain information server 200, and sets the gain of the input amplifier 12 corresponding to the vehicle speed in accordance with the acquired gain table 16. Thus, an appropriate gain can be set for the input amplifier 12 immediately after the start of the user's use of the voice input device 1.

It is therefore intended that the foregoing detailed description be regarded as illustrative rather than limiting, and that it be understood that it is the following claims, including all equivalents, that are intended to define the spirit and scope of this invention.

What is claimed is:

1. A speech recognition system mounted on a vehicle, comprising:
    a microphone configured to convert input voice into an input audio signal and output the input audio signal;
    a variable-gain input amplifier configured to amplify the input audio signal output by the microphone;
    a processor configured to perform speech recognition on voice represented by the input audio signal amplified by the input amplifier;
    a vehicle speed detector configured to detect a vehicle speed of the vehicle; a memory configured to store gain control information which records a correspondence between vehicle speeds of the vehicle and gains of the input amplifier; and
    a gain controller configured to acquire the vehicle speed detected by the vehicle speed detector, and to control a gain of the input amplifier to a gain recorded in the gain control information as a gain corresponding to the acquired vehicle speed.

2. The speech recognition system according to claim 1, wherein the gain control information records a correspondence between each vehicle speed range and the gain of the input amplifier corresponding to the vehicle speed range, and the gain of the input amplifier corresponding to the vehicle speed range is a gain that corresponds, in an experimentally determined frequency distribution of peak values of an input audio signal output by the microphone in the vehicle running at a vehicle speed within the vehicle speed range, to a maximum frequency of a peak value having a magnitude that falls within an input range of the processor when the gain is used for amplification; and
    wherein the gain controller is configured to acquire a vehicle speed detected by the vehicle speed detector, and to control the gain of the input amplifier to a gain recorded in the gain control information as a gain of the input amplifier corresponding to a vehicle speed range including the acquired vehicle speed.

3. The speech recognition system according to claim 1, further comprising a state detector configured to detect one or more predetermined states of the vehicle,
    wherein the gain control information records a correspondence between combinations of vehicle speed and the one or more predetermined states and gains of the input amplifier;
    the gain controller is configured to acquire a vehicle speed detected by the vehicle speed detector and a state detected by the state detector, and to control the gain of the input amplifier to a gain recorded in the gain control information as a gain corresponding to a combination of the acquired vehicle speed and the acquired state; and
    the one or more predetermined states include at least a vehicle window open/closed state indicating whether windows of the vehicle are open, or a vehicle wiper on/off state indicating whether a wiper of the vehicle is in operation.

4. The speech recognition system according to claim 1, further comprising an in-tunnel running detector configured to detect an in-tunnel/out-of-tunnel state indicating whether the vehicle is running in a tunnel,
wherein the gain control information records a correspondence between combinations of vehicle speed and in-tunnel/out-of-tunnel state and gains of the input amplifier; and
the gain controller is configured to acquire a vehicle speed detected by the vehicle speed detector and an in-tunnel/out-of-tunnel state detected by the in-tunnel running detector, and to control the gain of the input amplifier to a gain recorded in the gain control information as a gain corresponding to a combination of the acquired vehicle speed and the acquired in-tunnel/out-of-tunnel state.

5. The speech recognition system according to claim 1, further comprising:
a mobile communication device configured to perform mobile communication;
wherein the processor is further configured to access a server storing the gain control information through the mobile communication, to acquire the gain control information from the server, and to store the acquired gain control information in the memory.

6. The speech recognition system according to claim 1, further comprising:
a mobile communication device configured to perform mobile communication; wherein the processor is further configured to access a server storing gain control information for each vehicle type through the mobile communication, to acquire gain control information for a vehicle type of the vehicle having the speech recognition system thereon from the server, and to store the acquired gain control information in the memory.

7. Again setting system comprising: a speech recognition system mounted on a vehicle; and
a server configured to be accessible by the speech recognition system through mobile communication,
wherein the server includes:
a memory configured to store gain control information which records a correspondence between vehicle speeds of the vehicle and gains, and
a processor configured to provide the gain control information stored in the memory of the server to the speech recognition system accessing the server; and
wherein the speech recognition system includes
a mobile communication device configured to perform the mobile communication,
a microphone configured to convert input voice into an input audio signal and output the input audio signal,
a variable-gain input amplifier configured to amplify the input audio signal output by the microphone,
a vehicle speed detector configured to detect a vehicle speed of the vehicle,
a memory,
a processor configured to:
perform speech recognition on voice represented by the input audio signal amplified by the input amplifier, and
access the server through the mobile communication, to acquire the gain control information from the server, and to store the acquired gain control information in the memory of the speech recognition system, and a gain controller configured to acquire the vehicle speed detected by the vehicle speed detector, and to control a gain of the input amplifier to a gain recorded in the gain control information stored in the memory of the speech recognition system as a gain corresponding to the acquired vehicle speed.

8. The gain setting system according to claim 7, wherein:
the memory of the server is configured to store gain control information for each vehicle type;
the processor of the speech recognition system is configured to acquire, from the server, gain control information for a vehicle type of the vehicle having the speech recognition system mounted thereon, and to store the acquired gain control information in the memory of the speech recognition system; and
the gain control information for each vehicle type records a correspondence between vehicle speeds of the vehicle of the vehicle type and gains.

9. The gain setting system according to claim 7, wherein:
the processor of the server is further configured to manage the gain control information stored in the memory of the server;
the processor of the speech recognition system is further configured to:
detect a peak value of the input audio signal output by the microphone;
and
transmit, to the server through the mobile communication, peak value information including a peak value detected by the speech recognition system during speech recognition performed by the processor of the speech recognition system and a vehicle speed detected by the vehicle speed detector when the peak value is detected; and
on the basis of the received peak value information, the processor of the server is configured to:
determine, for each vehicle speed range, a frequency distribution of peak values contained in the peak value information including vehicle speeds within the vehicle speed range,
generate gain control information which records, as a gain corresponding to the vehicle speed range, a gain that corresponds, in the frequency distribution, to a maximum frequency of a peak value having a magnitude that falls within an input range of the speech recognition unit when the gain is used for amplification, and
store the generated gain control information in the memory of the server.

10. The gain setting system according to claim 8, wherein:
the processor of the server is configured to manage the gain control information stored in the memory of the server; and
the processor of the speech recognition system is configured to:
detect a peak value of the input audio signal output by the microphone, and
transmit, to the server through the mobile communication, peak value information including a peak value detected by the speech recognition system during speech recognition performed by the processor of the speech recognition unit, a vehicle speed detected by the vehicle speed detector when the peak value is detected, and a vehicle type of the vehicle having the speech recognition system mounted thereon; and
on the basis of the received peak value information, the processor of the server is configured to:

determine, for each vehicle speed range in each vehicle type, a frequency distribution of peak values contained in the peak value information including the vehicle type and vehicle speeds within the vehicle speed range,
- generate gain control information for the vehicle type recording, as a gain corresponding to the vehicle speed range, a gain that corresponds, in the frequency distribution, to a maximum frequency of a peak value having a magnitude that falls within an input range of the processor of the speech recognition system when the gain is used for amplification, and
- store the generated gain control information in the memory of the server.

* * * * *